(12) United States Patent
Huang

(10) Patent No.: US 7,445,986 B2
(45) Date of Patent: Nov. 4, 2008

(54) MEMORY CELLS WITH VERTICAL TRANSISTOR AND CAPACITOR AND FABRICATION METHODS THEREOF

(75) Inventor: Cheng-Chih Huang, His-Chih (TW)

(73) Assignee: Nanya Technology Corporation, Taoyuan (TW)

( * ) Notice: Subject to any disclaimer, the term of this patent is extended or adjusted under 35 U.S.C. 154(b) by 327 days.

(21) Appl. No.: 11/499,348

(22) Filed: Aug. 3, 2006

(65) Prior Publication Data

US 2006/0270144 A1 Nov. 30, 2006

Related U.S. Application Data

(62) Division of application No. 11/145,862, filed on Jun. 6, 2005, now Pat. No. 7,342,274.

(30) Foreign Application Priority Data

Feb. 5, 2005 (TW) .............................. 94103962 A

(51) Int. Cl.
*H01L 21/8242* (2006.01)
(52) U.S. Cl. ................ 438/242; 438/248; 257/E21.652

(58) Field of Classification Search ................. 438/242, 438/244, 246, 248; 257/E21.652
See application file for complete search history.

(56) References Cited

U.S. PATENT DOCUMENTS

| | | | |
|---|---|---|---|
| 4,713,678 A | 12/1987 | Womack et al. | |
| 5,821,579 A | 10/1998 | Choi et al. | |
| 6,309,924 B1 * | 10/2001 | Divakaruni et al. | ......... 438/248 |
| 6,700,150 B1 * | 3/2004 | Wu | ............................ 438/242 |
| 6,750,499 B2 | 6/2004 | Wu | |
| 6,808,979 B1 | 10/2004 | Lin et al. | |
| 2003/0062568 A1 | 4/2003 | Beintner | |
| 2004/0065914 A1 | 4/2004 | Koike et al. | |
| 2005/0285175 A1 | 12/2005 | Cheng et al. | |

\* cited by examiner

*Primary Examiner*—Chandra Chaudhari
(74) *Attorney, Agent, or Firm*—Quintero Law Office

(57) ABSTRACT

Memory cells with vertical transistor and capacitor and fabrication methods thereof. The memory cell comprises a substrate with a trench. A capacitor is disposed at the bottom of the trench. A first conductive layer is electrically coupled to the capacitor. The first conductive layer is isolated the substrate by a collar dielectric layer. A trench top oxide (TTO) layer is disposed on the first conductive layer. A vertical transistor is disposed over the TTO layer. The vertical transistor comprises a gate dielectric layer disposed on the sidewalls of the upper portion of the trench, and a metal gate disposed in the upper portion of the trench.

7 Claims, 14 Drawing Sheets

MEMORY CELLS WITH VERTICAL TRANSISTOR AND CAPACITOR AND FABRICATION METHODS THEREOF

This application is a divisional of U.S. application Ser. No. 11/145,862, filed Jun. 6, 2005.

BACKGROUND

The invention relates to memory cells, and more particularly, to memory cells with vertical transistor and capacitor and fabrication methods thereof.

Memory devices, such as dynamic random access memory (DRAM), for non-volatile storage of information, are currently in widespread use in a myriad of applications.

A conventional DRAM consists of a transistor and a capacitor, with electrical charges moving in or out of the capacitor during reading or writing. Typically a deep trench capacitor is used to reduce the size of a memory device. The capacitor is disposed in the deep trench bottom, the transistor is disposed at the deep trench top, and a thin dielectric layer, such as trench top oxide (TTO) layer, acting as an electrical insulating layer is disposed between the capacitor and the transistor.

FIGS. 1A-1F are cross sections of a conventional method for fabricating a memory cell with vertical transistor and capacitor. Referring to FIG. 1A, a semiconductor substrate 100 such as a single crystalline silicon wafer is provided with a pad silicon oxide 101 and a pad silicon nitride 102 thereon. A deep trench 110 is formed in the semiconductor substrate 100 employing the pad silicon oxide 101 and the silicon nitride 102 as mask. A storage capacitor 105 is formed at the bottom of the deep trench 110. A silicon oxide layer 104 is formed on the storage capacitor 105. A doped polysilicon layer 107 is formed on the silicon oxide layer 104 electrically coupling the storage capacitor 105. A trench top oxide (TTO) layer 108 is formed on the doped polysilicon layer 107 isolating the storage capacitor 105 and vertical transistor.

A diffusion region (not shown) is formed at sides of the TTO layer 108 in the semiconductor substrate 100. The diffusion region can serve as a drain of the vertical transistor. Next, a gate oxide layer 112 is conformably formed on the sidewalls of the deep trench 110.

Referring to FIG. 1B, a doped polysilicon layer 114 is formed in the deep trench 110 to serve as a gate of the vertical transistor. Next, the doped polysilicon layer 114 is planarized to expose the pad silicon nitride layer 102. The doped polysilicon layer 114 is formed by chemical vapor deposition (CVD). Since the doped polysilicon layer 114 is deposited from the sidewalls to a central region of the deep trench 110, the structure at the central region 115 of the deep trench 110 is less compact, thereby causing high resistance in the gate.

Referring to FIG. 1C, the doped polysilicon layer 114 and gate oxide layer 112 are etched back until lower the level of the semiconductor substrate 100 exposes a portion of the sidewalls of the trench and the pad silicon oxide 101 and the silicon nitride 102.

Referring to FIG. 1D, a silicon nitride layer 120 is conformably formed on the semiconductor substrate 100 covering the doped polysilicon layer 114, the gate oxide 112, the sidewall of the trench, the pad silicon oxide 101 and the silicon nitride 102. Next, the silicon nitride layer 120 is isotropically etched back to form a collar silicon nitride 120' on the sidewalls of the trench. Silicon nitride residue 120" accumulated at the central region of the trench is, however, quite difficult to remove, as shown in FIG. 1E.

Referring to FIG. 1F, a doped polysilicon layer 130 is formed in the trench, electrically coupling the gate 104 to serve as interconnect between the gate 104 and a word line (not shown). The neck R1 among the doped polysilicon layer 130, the gate 104, and the collar silicon nitride 120' has high impedance causing greater power consumption and energy loss at high operating frequency. Conversely, an interface R2 between the residue silicon nitride 120" and the gate 114 at center of the trench can cause open circuits in the memory cell.

SUMMARY

The invention is directed to memory cells with vertical transistor and capacitor and fabrication methods thereof. The vertical transistor comprises a metal gate reducing resistance of the gate of the vertical transistor, thereby improving electrical performance at high operating frequency.

Accordingly, the invention provides a memory cell with vertical capacitor and transistor. The memory cell comprises a substrate with a trench, a capacitor at the bottom of the trench, a first conductive layer electrically coupling to the capacitor, a trench top oxide (TTO) layer disposed on the first conductive layer and a vertical transistor disposed over the TTO layer. The vertical transistor comprises a gate dielectric layer disposed on the sidewalls of the upper portion of the trench, and a metal gate disposed in the upper portion of the trench.

The invention provides a memory cell with vertical capacitor and transistor. The memory cell comprises a substrate with a trench, a capacitor at the bottom of the trench, a first conductive layer electrically coupling the capacitor, a trench top oxide (TTO) layer disposed on the first conductive layer, a gate dielectric layer disposed on the sidewalls of the upper portion of the trench, and a metal gate disposed in the upper portion of the trench, wherein a doped polysilicon layer is interposed between the gate dielectric layer and the metal gate.

The invention provides a method for fabricating a memory cell with vertical capacitor and transistor, comprising: providing a substrate with a trench; forming a capacitor at the bottom of the trench; forming a first conductive layer electrically coupled to the capacitor; forming a trench top oxide (TTO) layer disposed on the first conductive layer; conformably forming a gate dielectric layer disposed on the sidewalls of the upper portion of the trench; forming a doped polysilicon layer on the gate dielectric layer filling the trench; etching the doped polysilicon layer until the level of the substrate is lowered; forming a collar spacer on the sidewall of the trench above the doped polysilicon layer; anisotropically etching the doped polysilicon layer to expose the TTO layer employing the collar spacer as a mask; forming a metal gate filling the upper portion of the trench.

BRIEF DESCRIPTION OF THE DRAWINGS

For a better understanding of the invention, reference is made to a detailed description to be read in conjunction with the accompanying drawings, in which.

DETAILED DESCRIPTION

Reference will now be made in detail to the preferred embodiments of the present invention, example of which is illustrated in the accompanying drawings.

Figure 2A:
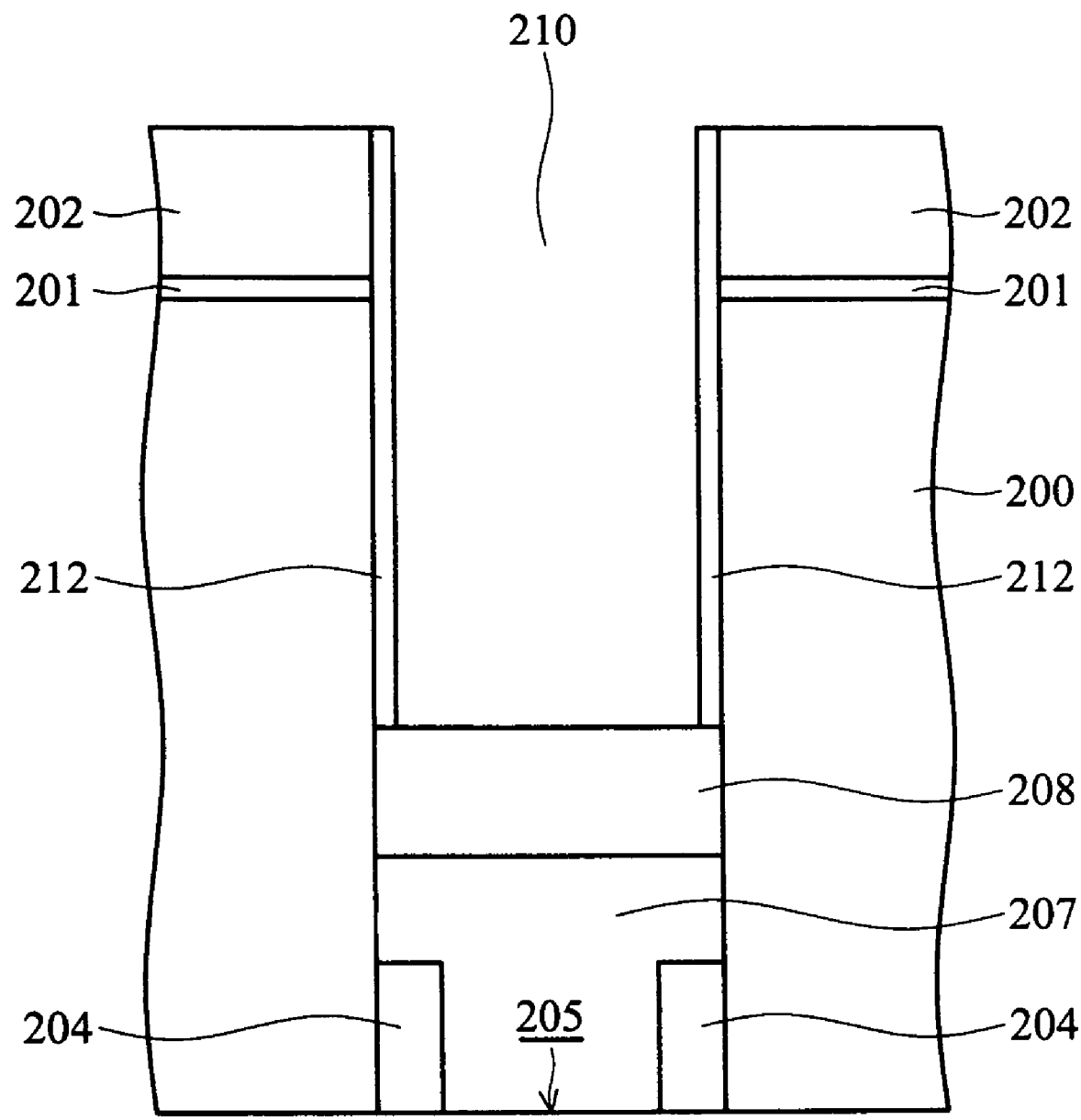
FIGS. 2A-2H are cross sections of an exemplary method for fabricating a memory cell with vertical transistor and capacitor according to the invention.

FIGS. 2A-2H are cross sections of an exemplary method for fabricating a memory cell with vertical transistor and capacitor according to the invention. Referring to FIG. 2A, a semiconductor substrate 200 such as a single crystalline silicon wafer is provided with a pad silicon oxide 201 and a silicon nitride 202 thereon. A deep trench 210 is formed in the semiconductor substrate 200 employing the pad silicon oxide 201 and the silicon nitride 202 as masks. A storage capacitor 205 is formed at the bottom of the deep trench 210. A silicon oxide layer 204 is formed on the storage capacitor 205. A doped polysilicon layer 207 is formed on the silicon oxide layer 204 electrically coupling the storage capacitor 205. According to the invention, the storage capacitor 205 can comprise a metal-insulator-metal (MIM) capacitor, a metal-insulator-semiconductor (MIS) capacitor, or semiconductor-insulator-semiconductor (SIS) capacitor, for example. A trench top oxide (TTO) layer 208 is formed on the doped polysilicon layer 207 isolating the storage capacitor 205 and the vertical transistor.

A diffusion region (not shown) is formed at sides of the TTO layer 208 in the semiconductor substrate 200. The diffusion region can serve as a drain of the vertical transistor. Next, a gate oxide layer 212 is conformably formed on the sidewalls of the deep trench 210.

Figure 2B:
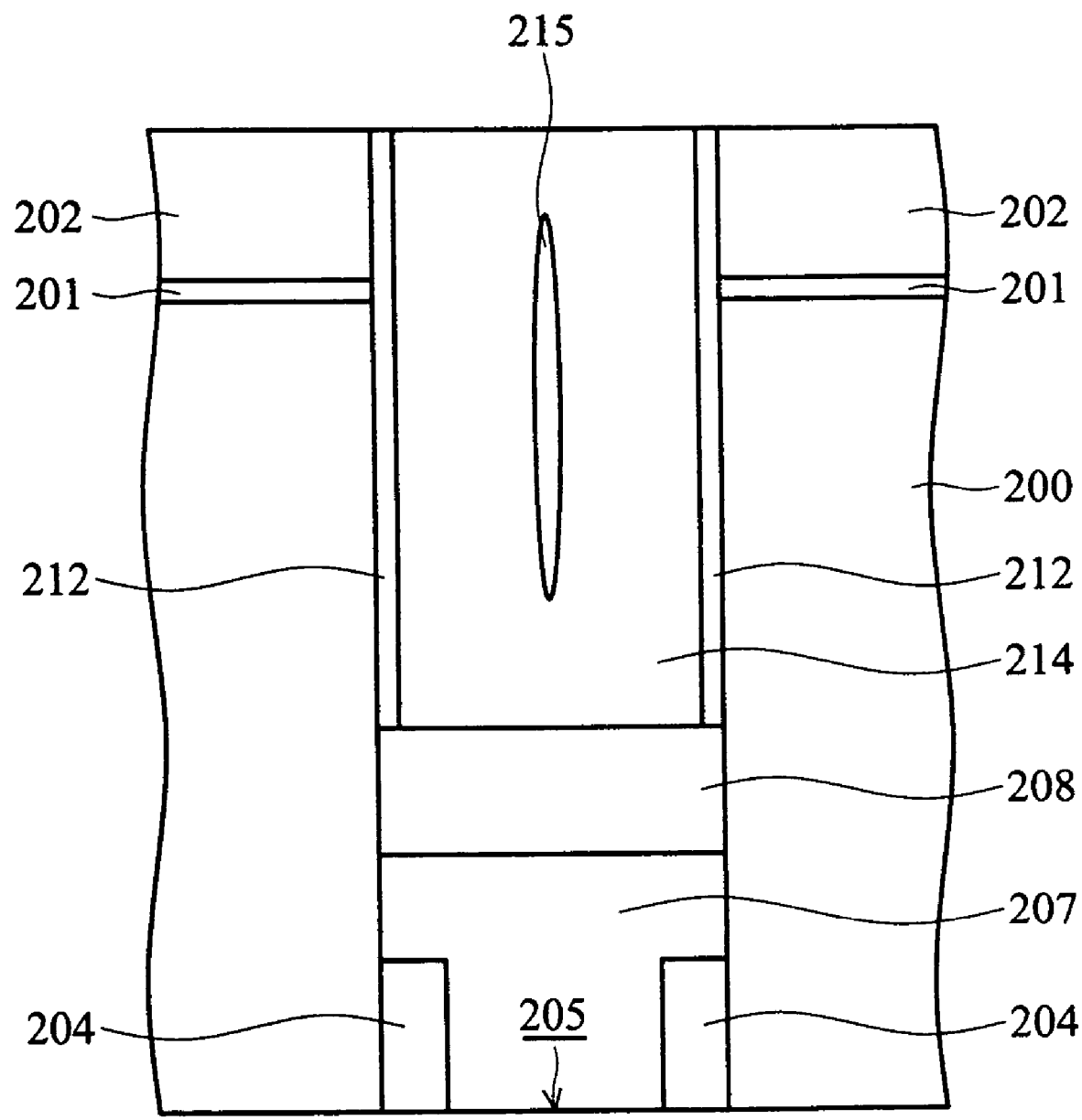

Referring to FIG. 2B, a doped polysilicon layer 214 is formed in the deep trench 210 to serve as a gate of the vertical transistor. Next, the doped polysilicon layer 214 is planarized to expose the pad silicon nitride layer 102. The doped polysilicon layer 214 is formed by chemical vapor deposition (CVD). Since the doped polysilicon layer 214 is deposited from the sidewalls to the center of the deep trench 210, the structure at a central region 215 of the deep trench 210 is less compact, thereby causing high resistance in the gate.

Figure 2C:
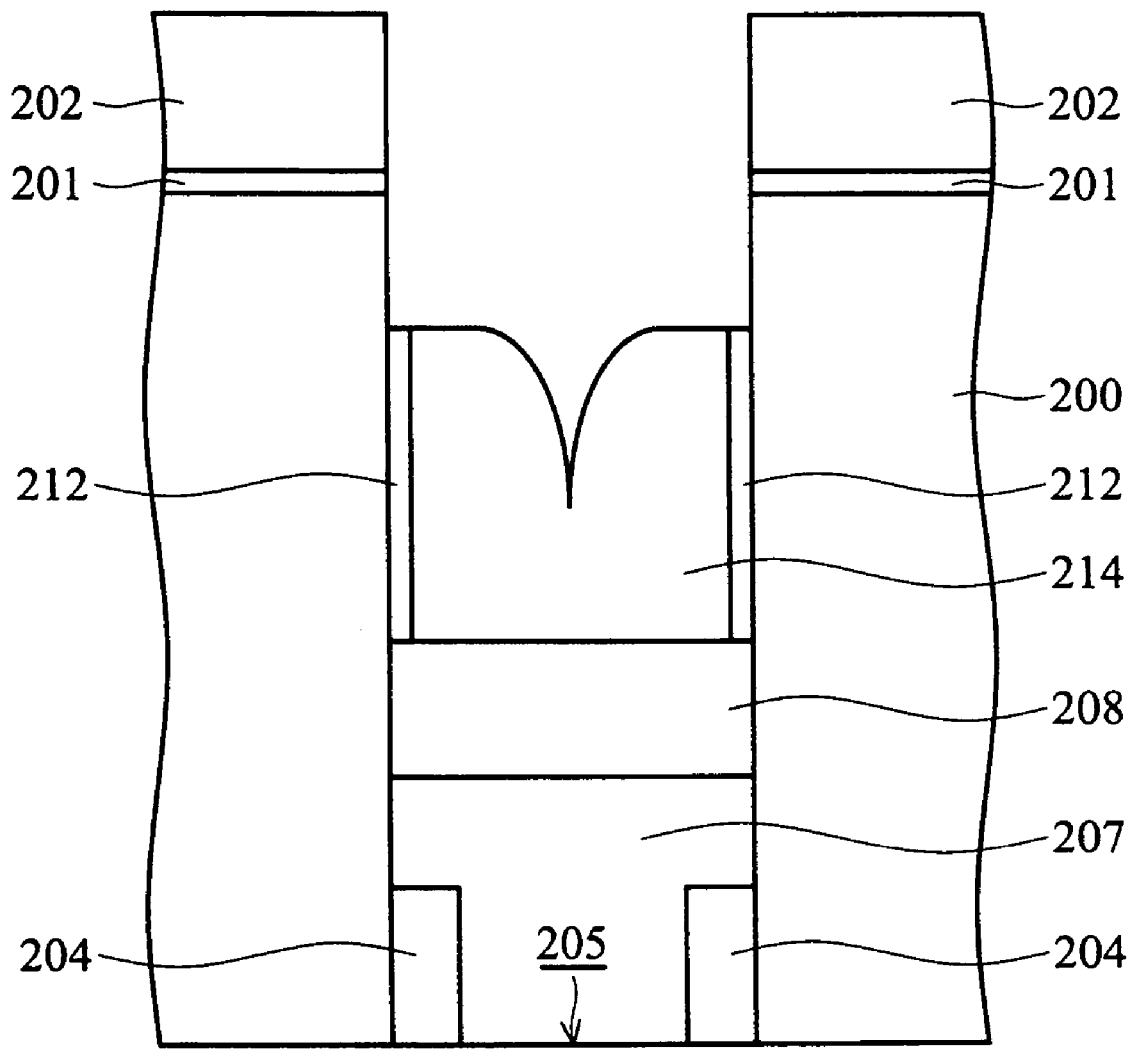

Referring to FIG. 2C, the doped polysilicon layer 214 and the gate oxide layer 212 are etched back until lower the level of the semiconductor substrate 200 exposing a portion of sidewall of the trench and the pad silicon oxide 201 and the silicon nitride layer 202.

Figure 2D:
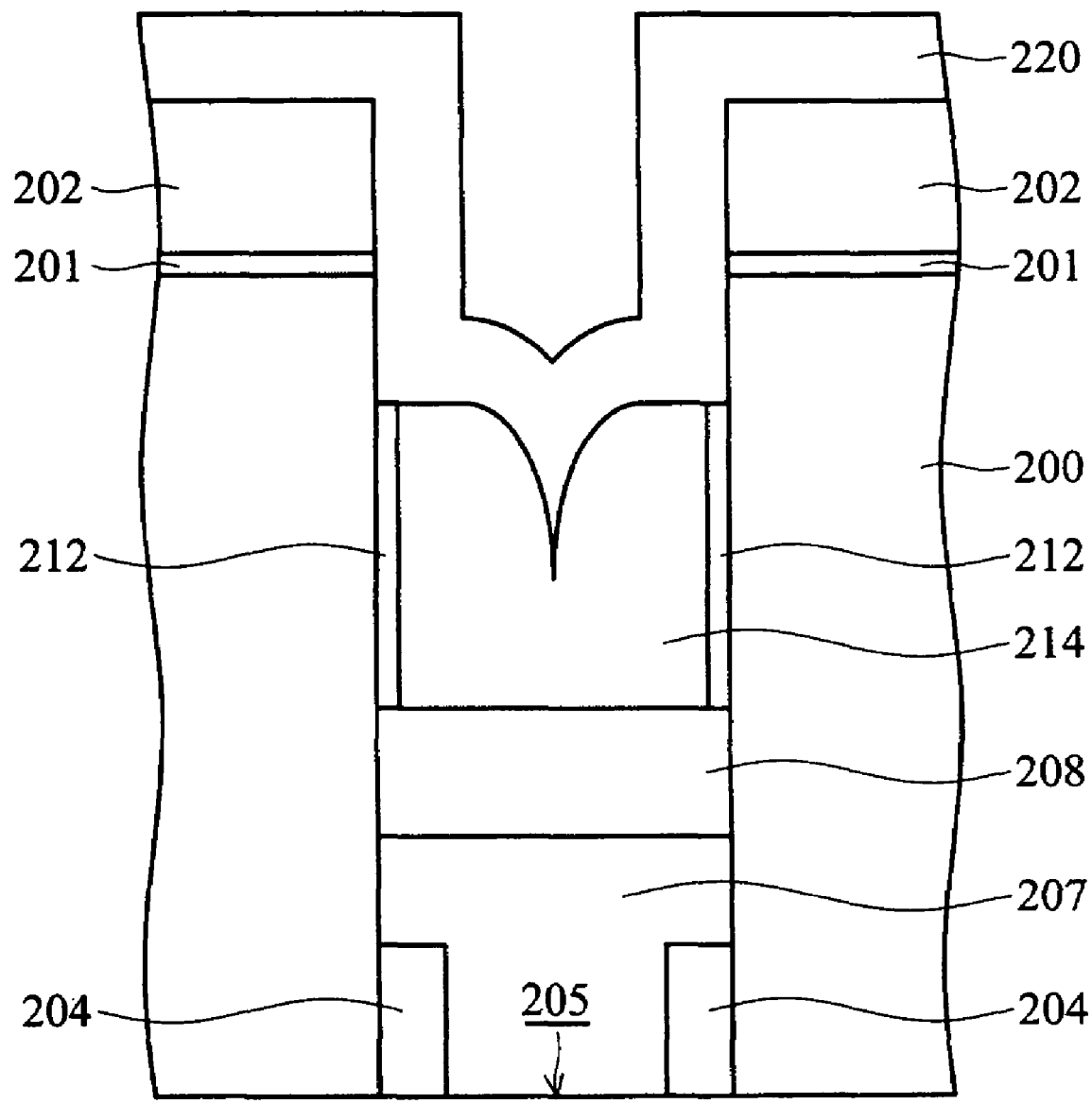
Figure 2E:
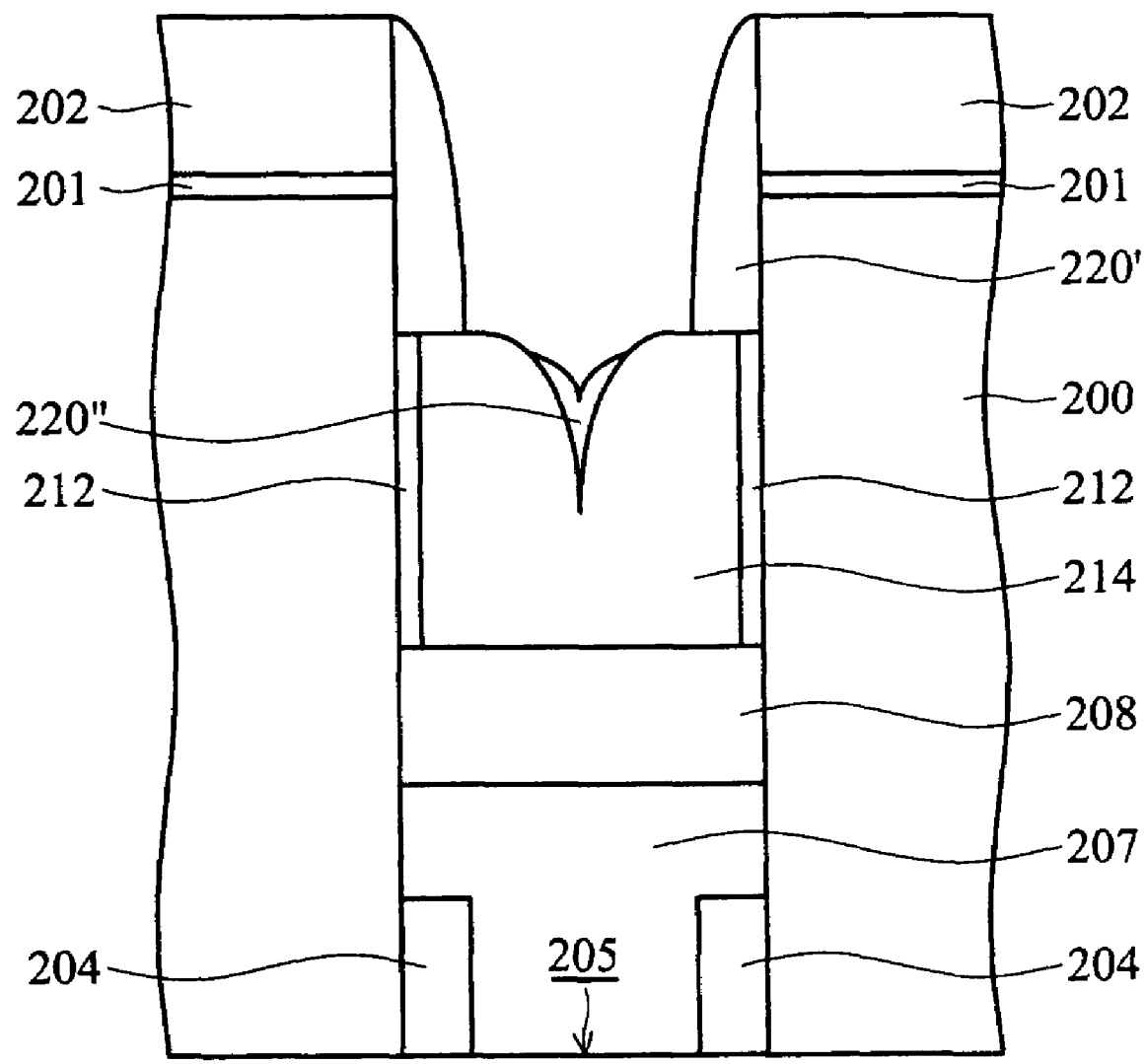

Referring to FIG. 2D, a silicon nitride layer 220 is conformably formed on the semiconductor substrate 200 covering the doped polysilicon layer 214, the gate oxide 212, the sidewall of the trench, the pad silicon oxide 201 and the silicon nitride 202. Next, the silicon nitride layer 220 is isotropically etched back to form a collar silicon nitride 220' on the sidewalls of the trench. Silicon nitride residue 220" accumulated at the central region of the trench is, however, quite difficult to remove, as shown in FIG. 2E.

Figure 2F:
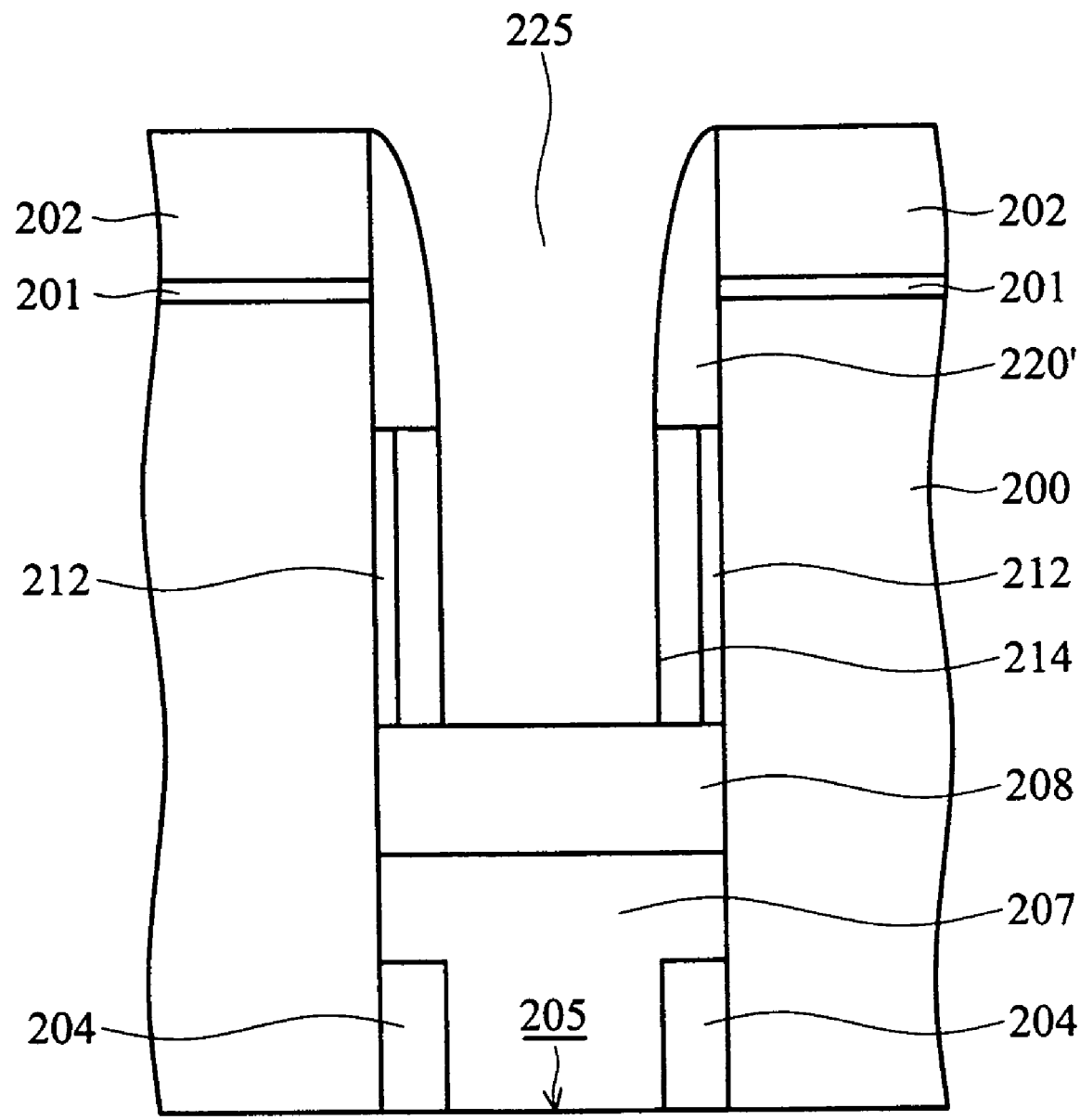

Referring to FIG. 2F, a portion of the doped polysilicon 214 is anisotropically etched by reactive ion etching (RIE) employing the collar silicon nitride 220' as masks. The doped polysilicon 214 and the silicon nitride residue 220" at the central region of the trench are removed simultaneously, creating a trench 225 exposing the TTO layer 208.

Figure 2G:
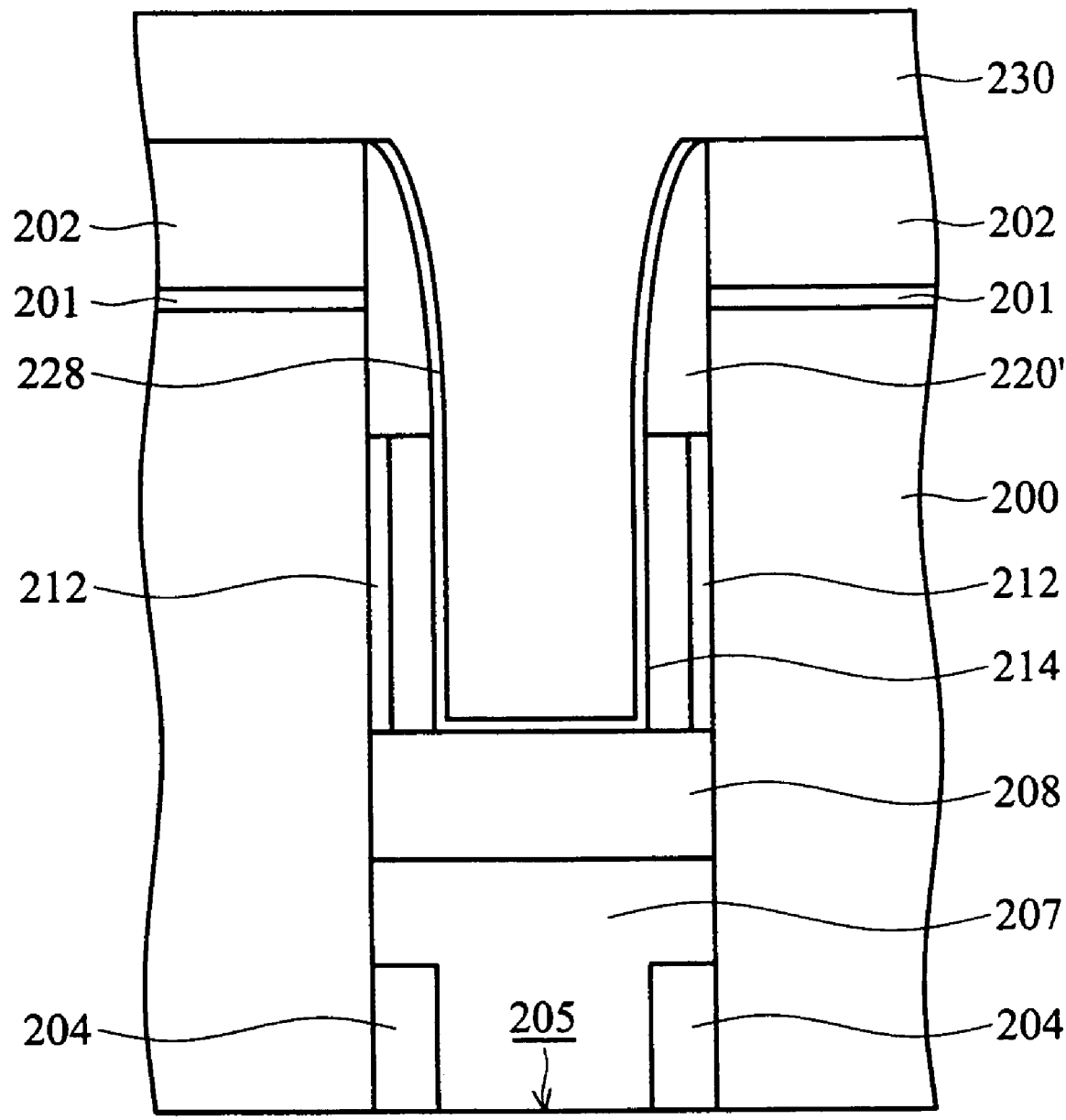

Referring to FIG. 2G, a thin barrier layer 228 is conformably formed in the trench 225. The barrier layer 228 can be made of WN, Ti/WN, or TiN deposited by CVD, for example. Next, a metal layer 230 such as Al, W, or Cu is formed on the substrate 200 filling the trench 225. The metal layer 230 can be deposited by PVD, CVD, or electrochemical deposition (ECD), for example. The barrier layer 228 can prevent diffusion of the metal layer 230 into the doped polisilicon layer 214 or the semiconductor substrate 200.

Figure 1A:
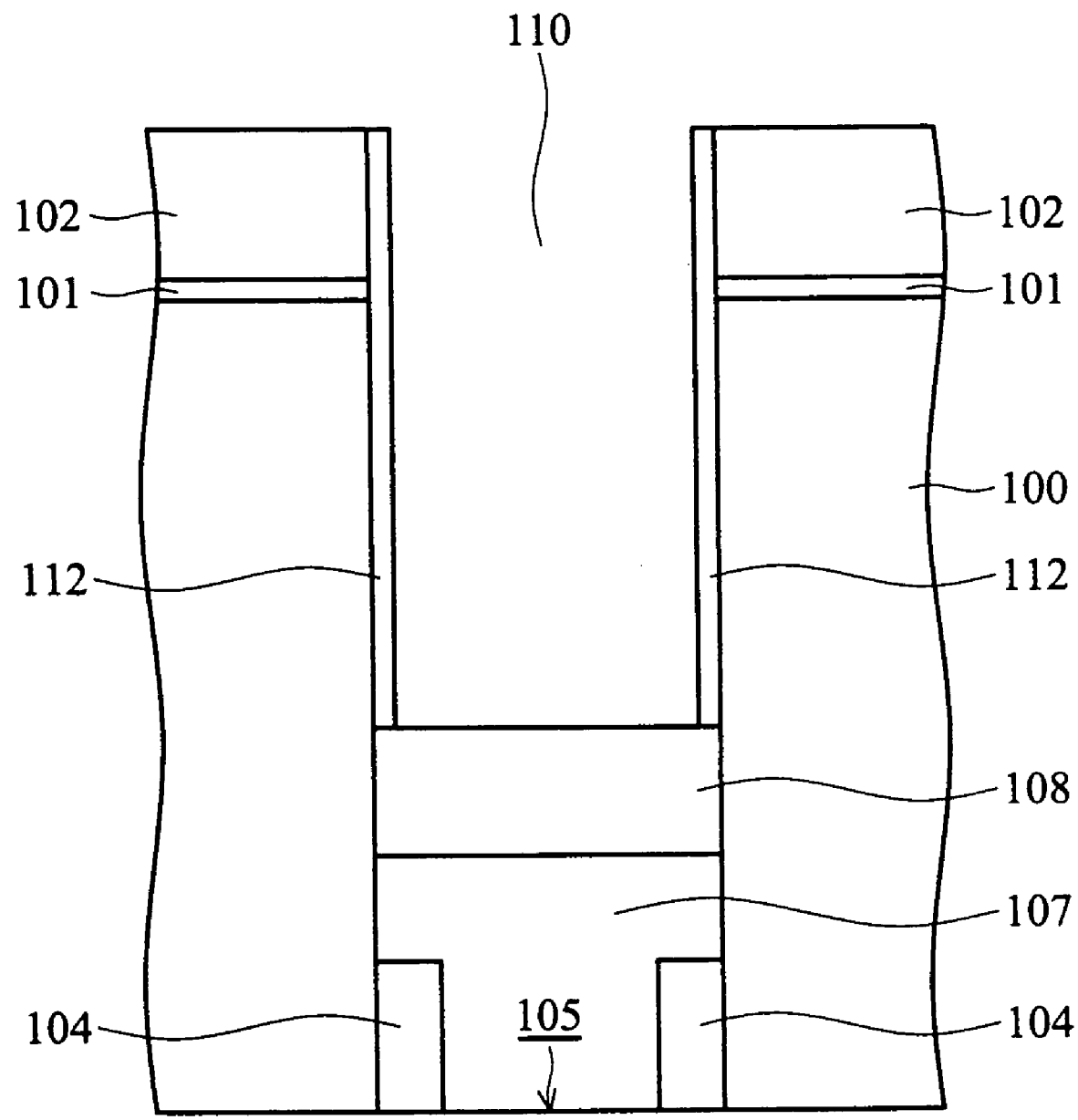
FIGS. 1A-1F are cross sections of a conventional method for fabricating a memory cell with vertical transistor and capacitor.
Figure 1B:
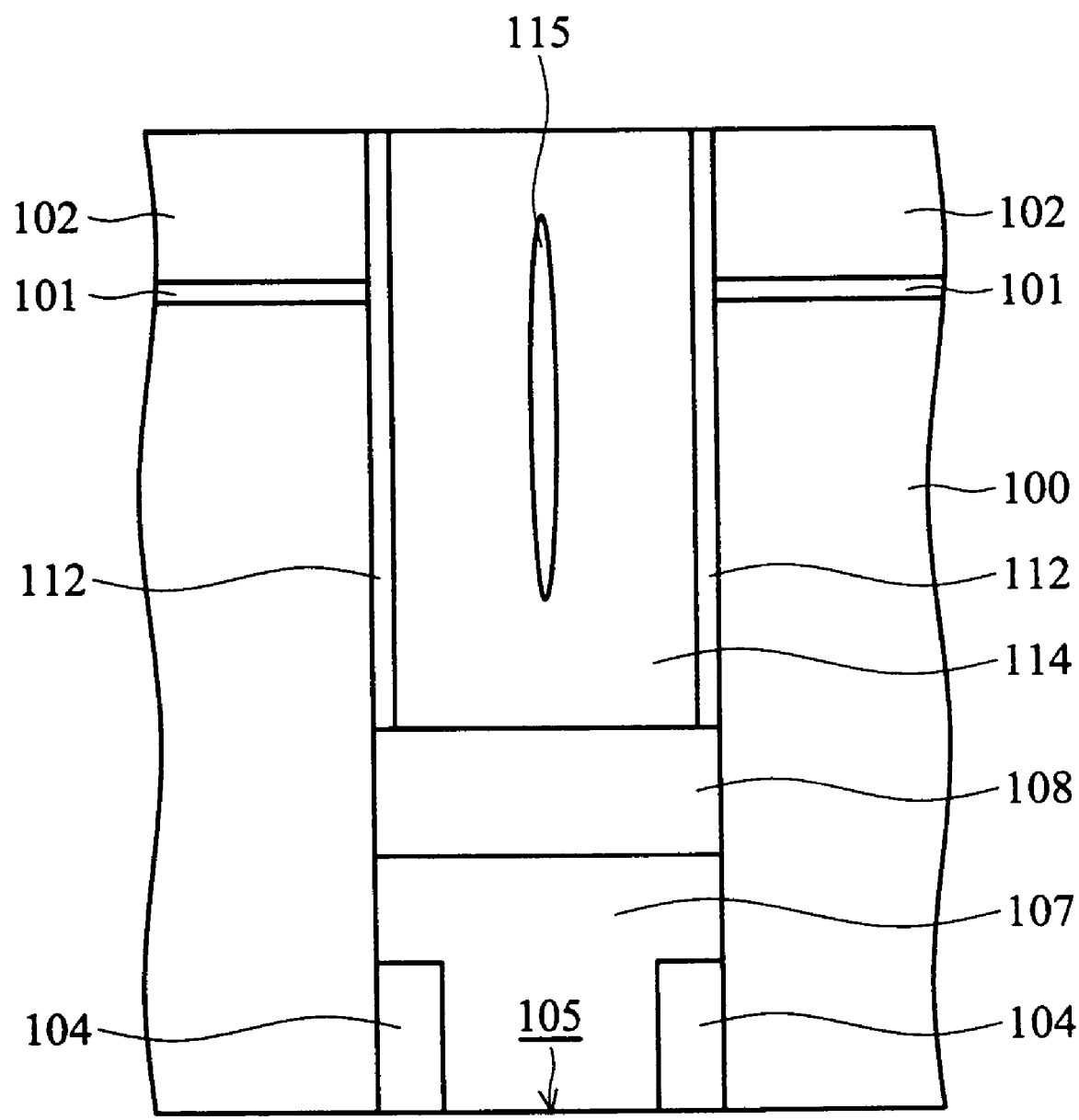
Figure 1C:
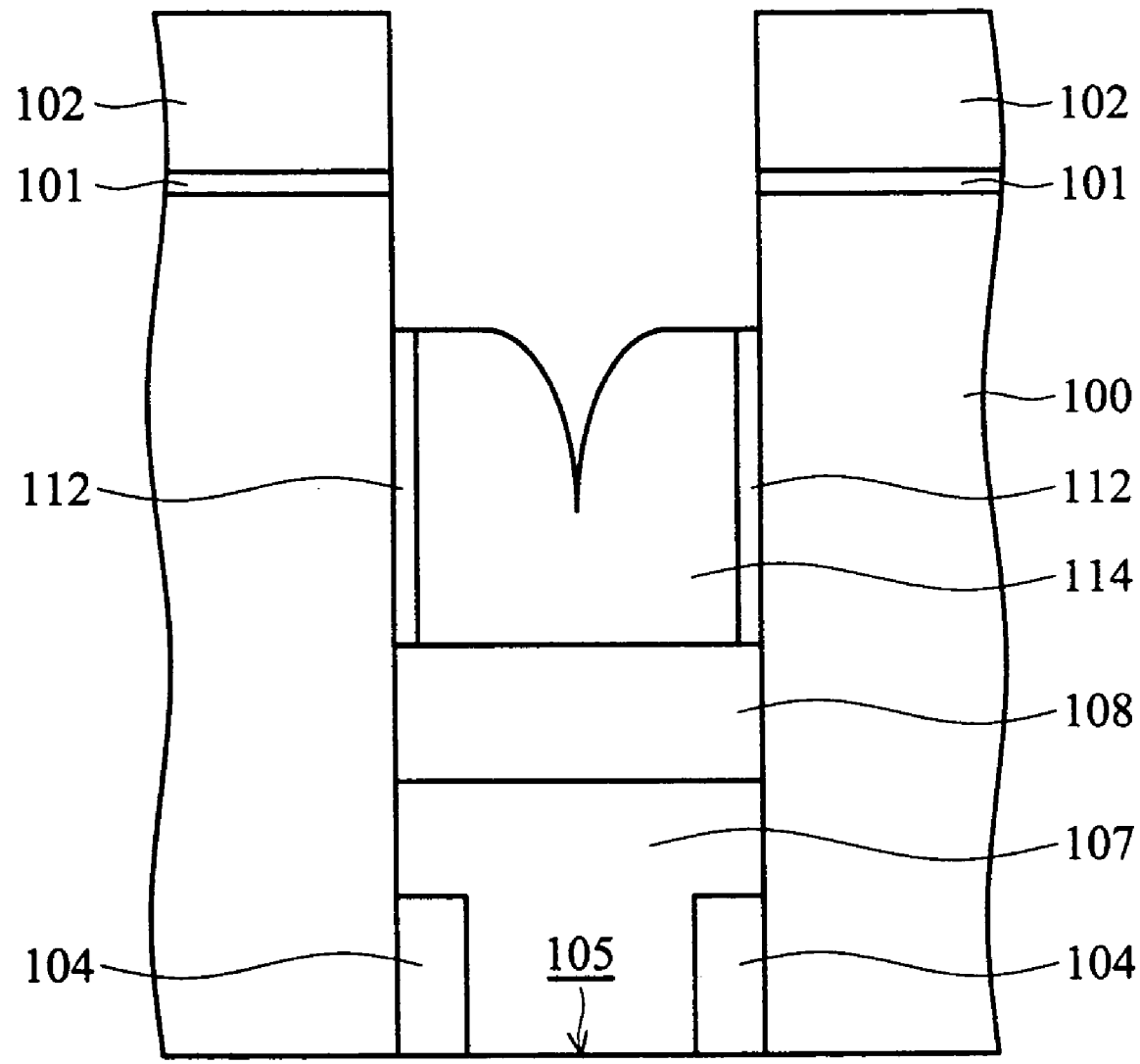
Figure 1D:
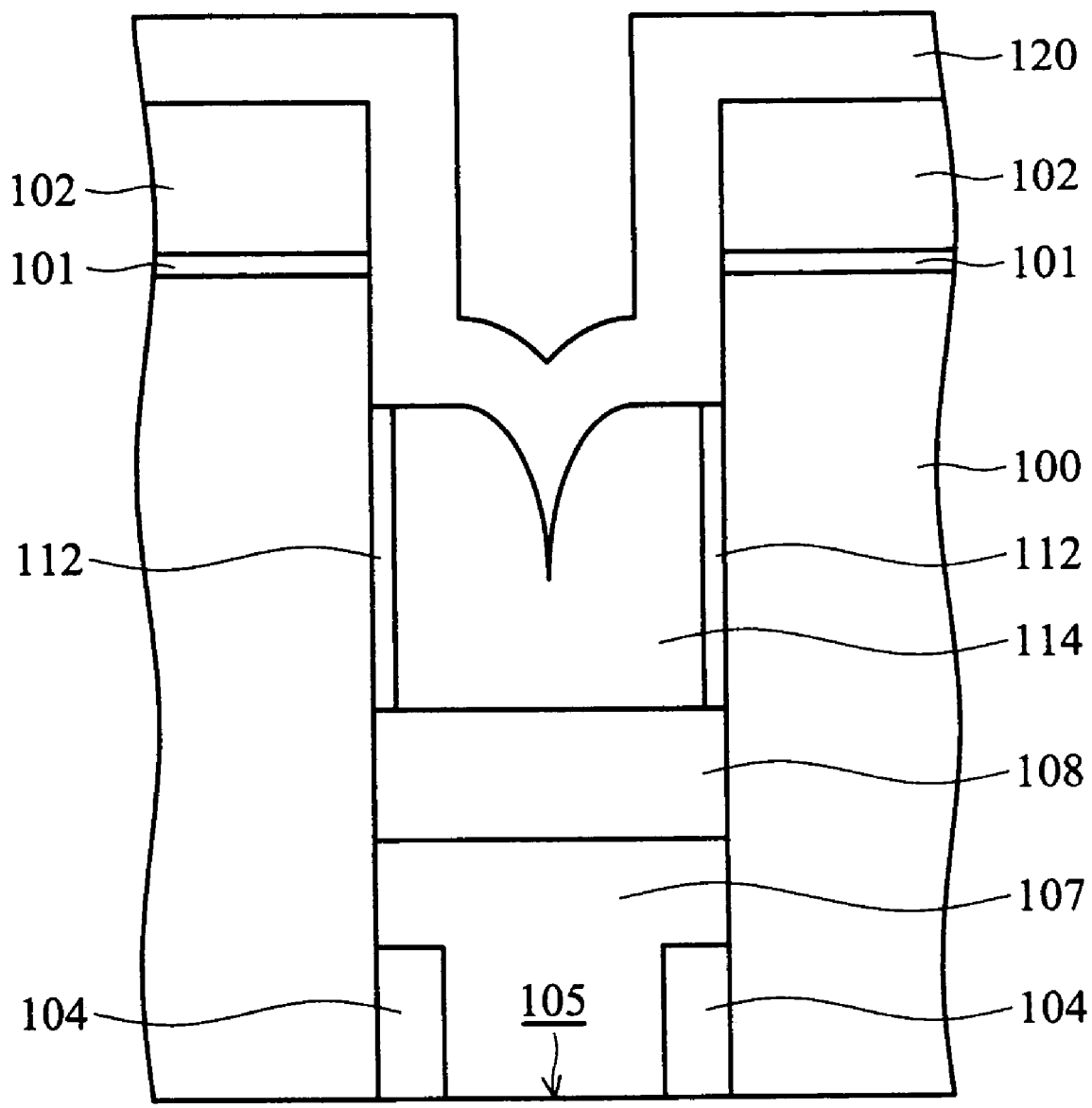
Figure 1E:
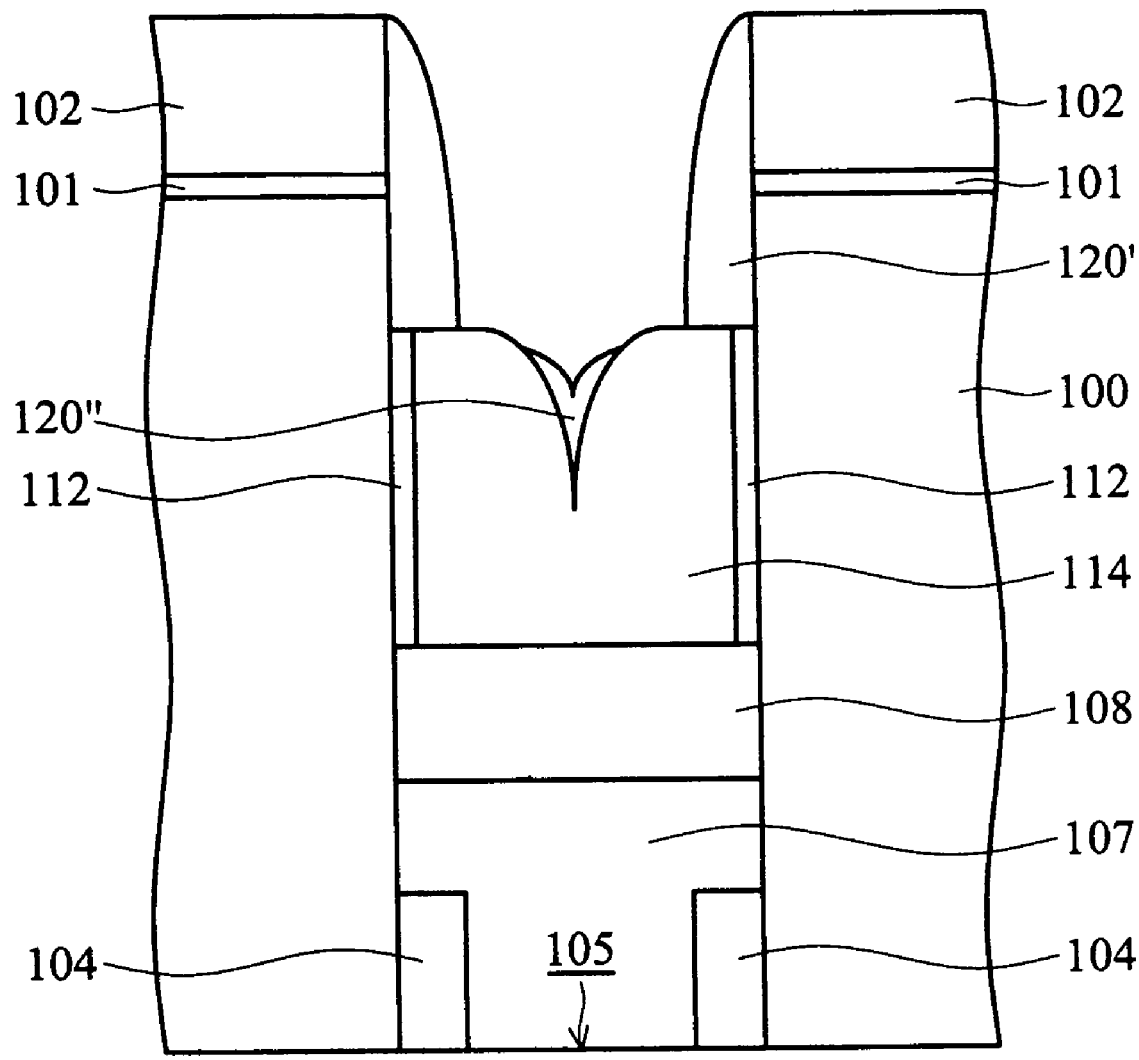
Figure 1F:
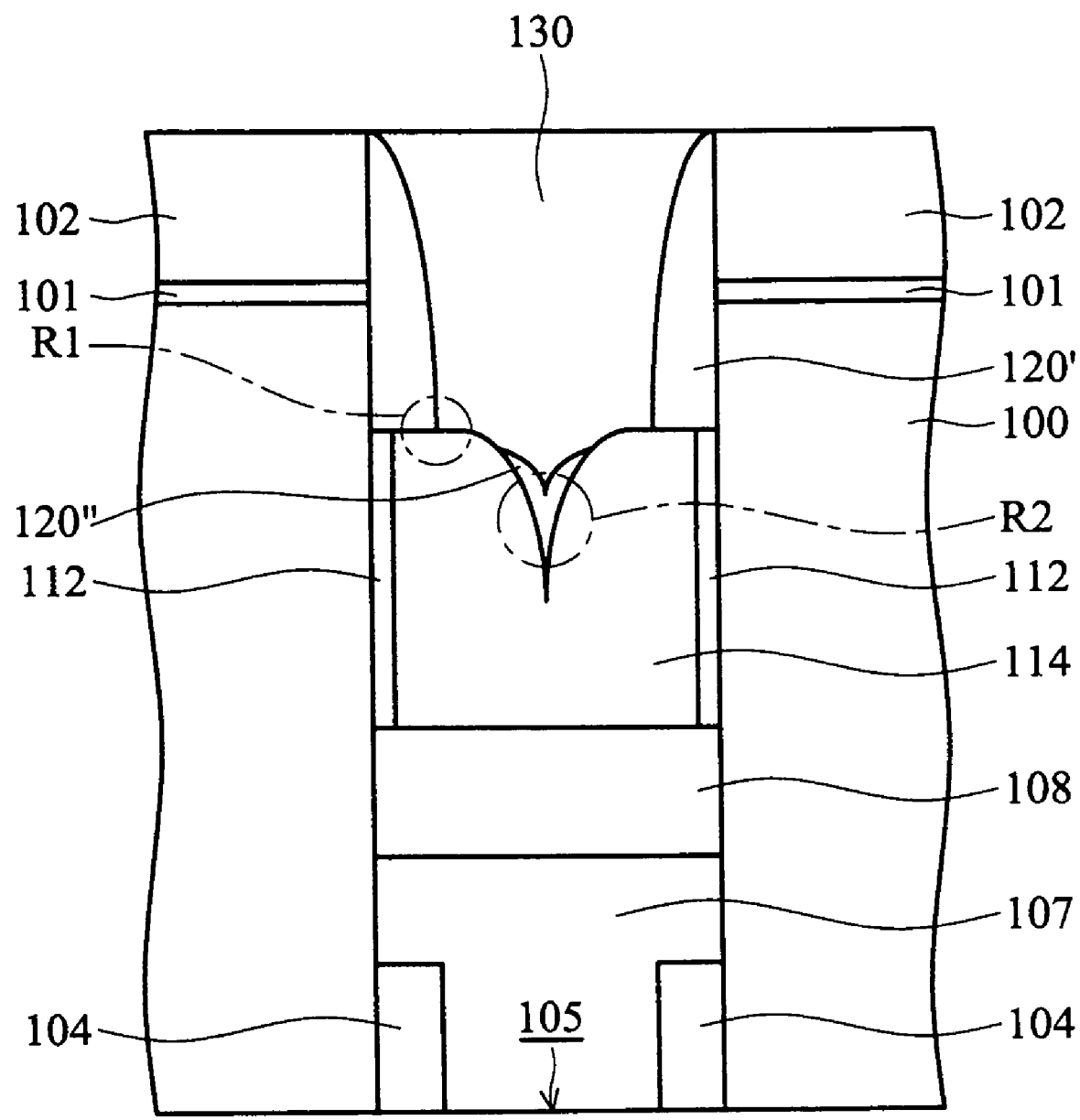
Figure 2H:
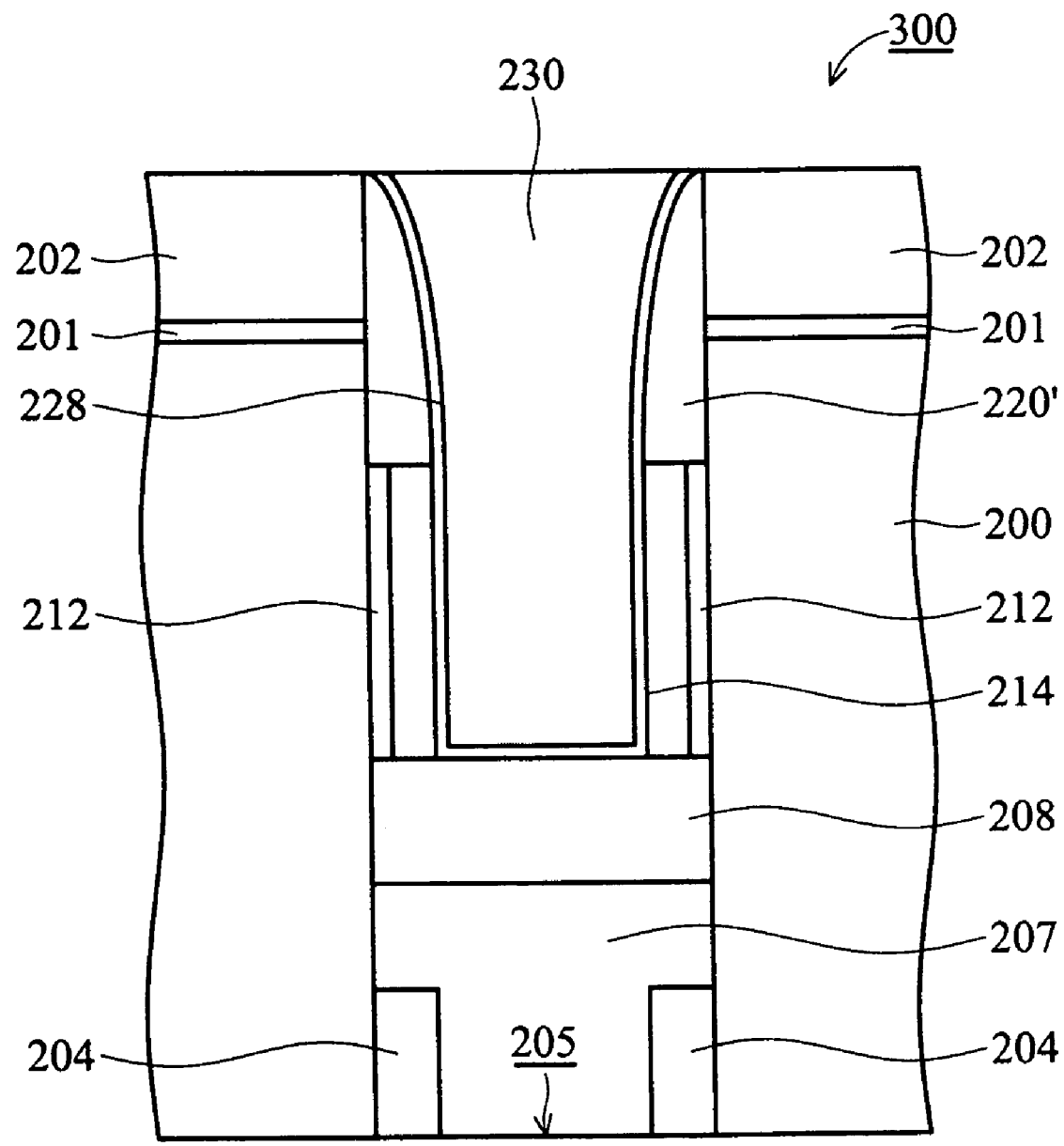

Referring to FIG. 2H, the metal layer 230 is planarized by chemical mechanical polishing (CMP) until the pad layer 202 exposed. According to the invention, the metal layer 230 in the trench 225 can reduce resistance of the gate of the vertical transistor, thereby improving electrical performance at high operating frequency. The shortcomings caused by the neck R1 and interface R2 in FIG. 1F can be overcome since the silicon nitride residue 220" is removed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a memory cell with vertical capacitor and transistor, comprising:
   providing a substrate with a trench;
   forming a capacitor at the bottom of the trench;
   forming a first conductive layer electrically coupled to the capacitor, the first conductive layer being isolated the substrate by a collar dielectric layer;
   forming a trench top oxide (TTO) layer disposed on the first conductive layer;
   conformably forming a gate dielectric layer disposed on the sidewalls of the upper portion of the trench;
   forming a doped polysilicon layer on the gate dielectric layer filling the trench;
   etching the doped polysilicon layer until lower the level of the substrate;
   forming a collar spacer on the sidewall of the trench above the doped polysilicon layer;
   anisotropically etching the doped polysilicon layer to expose the TTO layer employing the collar spacer as a mask;
   forming a metal gate filling the upper portion of the trench.

2. The method as claimed in claim 1, wherein the doped polysilicon layer is interposed between the metal gate and the gate dielectric layer.

3. The method as claimed in claim 1, wherein the metal gate comprises W, Al, or Cu.

4. The method as claimed in claim 1, further comprising forming a barrier layer interposed between the metal gate and the doped polysilicon layer.

5. The method as claimed in claim 1, wherein the doped polysilicon layer is etched by reactive ion etching (RIE).

6. The method as claimed in claim 1, wherein the collar spacer is made of silicon nitride.

7. The method as claimed in claim 4, wherein the barrier layer comprises WN, Ti/WN, or TiN.

* * * * *